US009147812B2

(12) United States Patent
Andrews

(10) Patent No.: US 9,147,812 B2
(45) Date of Patent: Sep. 29, 2015

(54) METHODS OF ASSEMBLY FOR A SEMICONDUCTOR LIGHT EMITTING DEVICE PACKAGE

(75) Inventor: Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 1130 days.

(21) Appl. No.: 12/145,280

(22) Filed: Jun. 24, 2008

(65) Prior Publication Data

US 2009/0315061 A1  Dec. 24, 2009

(51) Int. Cl.
*H01L 21/00* (2006.01)
*H01L 33/48* (2010.01)

(52) U.S. Cl.
CPC ....... *H01L 33/48* (2013.01); *H01L 2224/83192* (2013.01)

(58) Field of Classification Search
CPC .......... H01L 2924/00014; H01L 2924/00; H01L 2224/13111
USPC ............................... 438/26; 257/99
See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter, Jr. | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,335,063 B1 * | 1/2002 | Chen et al. | 427/558 |
| 6,853,010 B2 | 2/2005 | Slater, Jr. et al. | |
| 6,888,167 B2 | 5/2005 | Slater, Jr. et al. | |
| 7,211,833 B2 | 5/2007 | Slater, Jr. et al. | |
| 7,230,818 B2 * | 6/2007 | Noguchi et al. | 361/528 |
| 7,329,905 B2 | 2/2008 | Ibbetson et al. | |
| 2002/0123164 A1 | 9/2002 | Slater, Jr. et al. | |
| 2002/0141462 A1 * | 10/2002 | Komeda | 372/29.02 |
| 2003/0006418 A1 | 1/2003 | Emerson et al. | |
| 2003/0015721 A1 * | 1/2003 | Slater et al. | 257/99 |
| 2005/0051881 A1 * | 3/2005 | Chen et al. | 257/678 |

(Continued)

OTHER PUBLICATIONS

Yang and Chen, "Develpment of electrodless plating method for silver film preparations for surface-enhanced infrared absorption measurements". vol. 55, No. 4, 2001, p. 399.*

*Primary Examiner* — Mark A Laurenzi
(74) *Attorney, Agent, or Firm* — Myers Bigel Sibley & Sajovec, PA

(57) ABSTRACT

Methods of assembly for a semiconductor light emitting device package may include positioning a submount on a mounting substrate with a flux material therebetween and at least substantially free of solder material therebetween. The submount has a metal bonding layer facing the mounting substrate. A semiconductor light emitting device is positioned on a top side of the submount with a flux material therebetween to provide an assembled stack. The assembled stack is reflowed to attach the metal bonding layer of the submount to the mounting substrate and to attach the light emitting device to the submount.

19 Claims, 8 Drawing Sheets

(56) References Cited

U.S. PATENT DOCUMENTS

| | | | |
|---|---|---|---|
| 2006/0063287 A1* | 3/2006 | Andrews | 438/22 |
| 2006/0076671 A1* | 4/2006 | Kariya et al. | 257/702 |
| 2006/0097335 A1* | 5/2006 | Kim et al. | 257/433 |
| 2007/0001315 A1* | 1/2007 | Yokoyama et al. | 257/779 |
| 2007/0146639 A1 | 6/2007 | Conner | |
| 2007/0201213 A1 | 8/2007 | Shin et al. | |
| 2008/0202682 A1* | 8/2008 | Husemann et al. | 156/320 |
| 2008/0231305 A1* | 9/2008 | Khandros et al. | 324/761 |

\* cited by examiner

FIG. 6
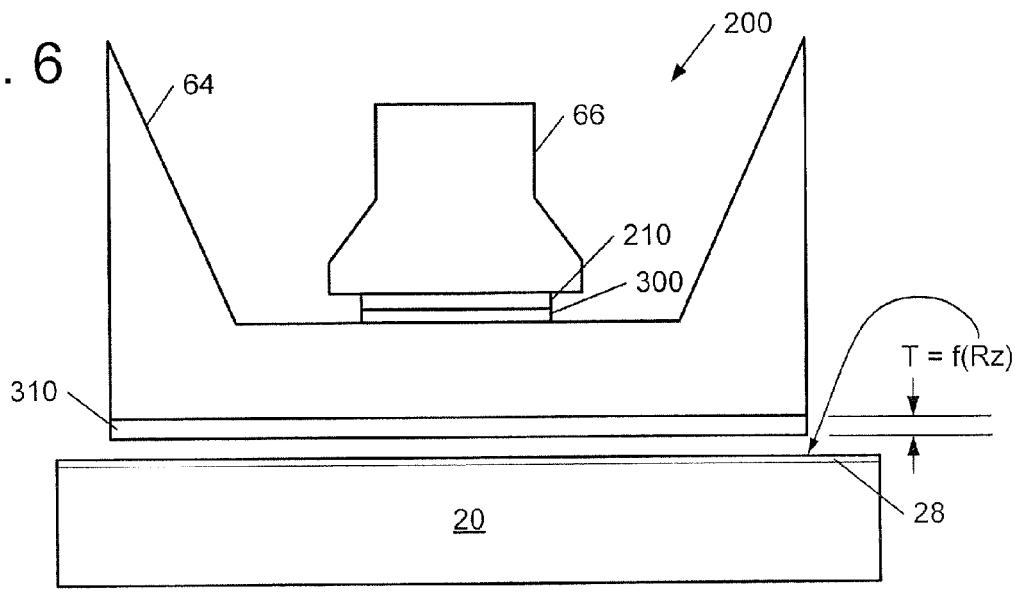
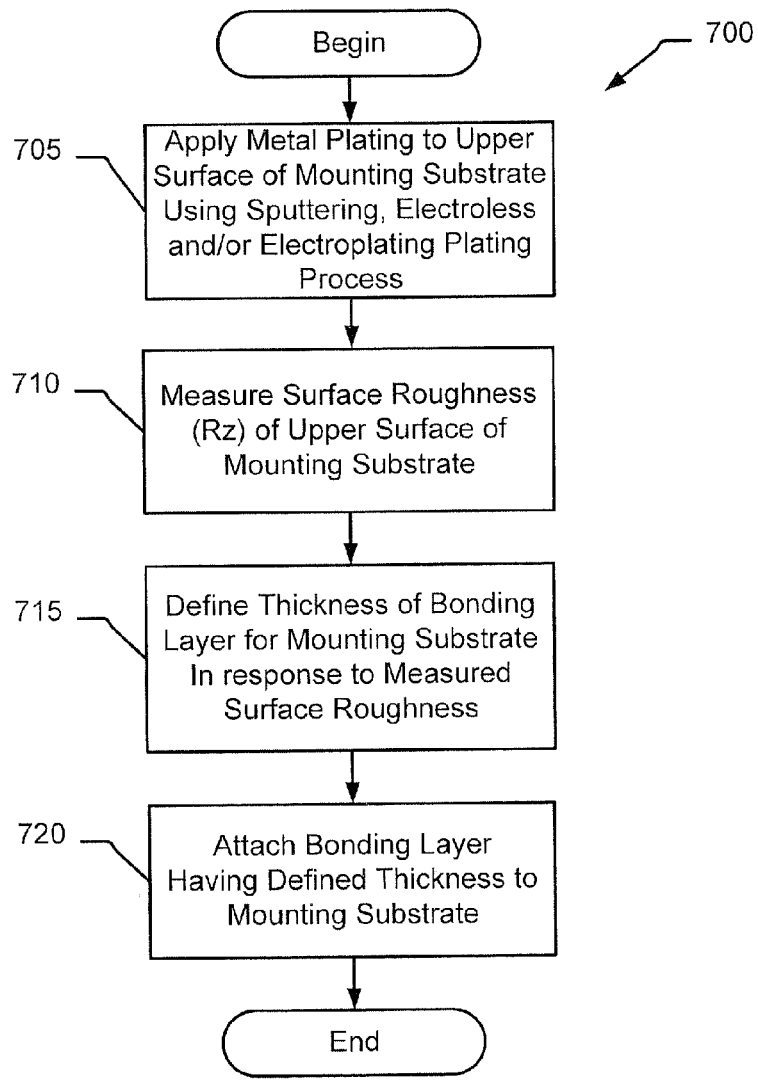
FIG. 9

METHODS OF ASSEMBLY FOR A SEMICONDUCTOR LIGHT EMITTING DEVICE PACKAGE

BACKGROUND OF THE INVENTION

This invention relates to microelectronic devices and fabrication methods therefor, and more particularly to light emitting devices, such as light emitting diodes (LEDs) and manufacturing methods therefor.

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new lighting applications, and may place LEDs in a position to compete with the well entrenched incandescent and fluorescent lamps.

Gallium Nitride (GaN)-based LEDs typically include an insulating or semiconducting substrate, such as silicon carbide (SiC) or sapphire, on which a plurality of GaN-based epitaxial layers are deposited. The epitaxial layers include an active or diode region having a p-n junction which emits light when energized.

LEDs may be mounted substrate side down onto a submount, also called a package or lead frame (hereinafter referred to as a "submount"). In contrast, flip-chip mounting of light emitting diodes involves mounting the LED onto the submount with the substrate side facing up (i.e. away from the submount). Light may be extracted and emitted through the substrate. Flip chip mounting may be an especially desirable technique for mounting SiC-based LEDs. In particular, because SiC has a higher index of refraction than GaN, light generated in the active or diode region generally does not totally internally reflect (i.e. reflect back into the GaN-based layers) at the GaN/SiC interface. Flip chip mounting of SiC-based LEDs also can improve the effect of certain substrate-shaping techniques known in the art. Flip chip packaging of SiC LEDs may have other benefits, such as improved heat dissipation, which may be desirable depending on the particular application for the LED.

One potential problem with flip-chip mounting is that when an LED is mounted on a submount using conventional techniques, a conductive die attach material such as silver epoxy is deposited on the LED and/or on the package, and the LED and the submount are pressed together. This can cause the viscous conductive die attach material to squeeze out and make contact with the N-type substrate and/or layers in the device, thereby forming a connection that can short-circuit the p-n junction in the active region.

Metal-metal bonds formed by soldering, thermosonic scrubbing and/or thermocompression bonding are alternative attach techniques. However, tin (Sn) is a component of most types of solder, and migration of Sn from the bonded surface into the device can cause unwanted degradation of the device. Such migration can interfere with metal-semiconductor interfaces such as ohmic contacts and/or the function of metal-metal interfaces such as reflective interfaces that serve as mirrors.

Semiconductor light emitting devices, such as LEDs, may be first attached to a submount and then the submount may be mounted to a substrate. So as to distinguish the substrate to which the submount is mounted from the semiconductor substrate on which the light emitting device is fabricated, the substrate to which the submount is mated will be referred to herein as a "mounting substrate." The mounting substrate may, in turn, be mounted to a circuit board or other electrical circuit depending upon the particular application for the LED. Each of these connections typically includes both electrical and physical connection aspects.

A common form of connection used for mounting an LED to a submount and a submount to a mounting substrate is soldering using, for example, a die solder process. Soldering may be used to provide a metal-to-metal connection providing mechanical mounting, a thermal pathway and an electrical connection. Solder materials may generally be categorized as low temperature, medium temperature and high temperature solders. The temperature categorization may be based on the eutectic temperature of a particular composition. For example, a solder paste with particles of a silver-tin (AgSn) alloy with eighty percent (80%) silver generally has an associated solder temperature of about 220 degrees centigrade (° C.), making it a medium temperature solder material. A high temperature solder paste can include, for example, gold-tin (AuSn) particles having a solder temperature of about 280° C. A low temperature solder paste can include, for example, lead-tin (PbSn) particles having a solder temperature of about 180° C.

It is generally preferable not to reflow a previously formed solder connection. Thus, in applications involving multiple solder reflow process steps, different temperature solder materials may be selected so that subsequent reflow process steps do not detrimentally impact previously formed solder bonds. For example, it is known to use a high temperature solder paste to connect an LED to a submount in combination with a medium temperature solder paste for connecting the submount to a mounting substrate. A low temperature solder paste may then be used for connecting the mounting substrate to a circuit board. Thus, each subsequent process step may be carried out at a temperature below the reflow temperature for the previously formed solder connection. However, it is also known to use a high temperature solder paste to connect an LED to a submount and then a high temperature solder paste to connect the submount to a substrate and then a medium temperature solder paste to connect the assembly to a circuit board and a low temperature solder paste to connect the circuit board to a mother board.

It is also known to use a medium temperature solder paste for the LED to submount connection in combination with a low temperature solder paste for the submount to mounting substrate connection. The mounting substrate may then be connected to the circuit board using a low temperature solder paste but in a manner that reduces the heating of the submount to mounting substrate connection to avoid reflow of that connection in the later process. For example, the mounting substrate may be mounted to the circuit board using standoffs providing thermal isolation from the heat used to solder the standoffs to the circuit board. Similarly, it has been proposed to use leads offset to the side from the submount to provide thermal isolation of the LED to submount solder bond from the heat generated when soldering the submount leads to the circuit board. However, these various approaches may not be compatible with higher density circuit board mounting techniques, particularly in surface mount applications that are generally used where higher density mounting of components on the circuit board is desired.

SUMMARY OF THE INVENTION

Some embodiments of the present invention provide methods of assembly for a semiconductor light emitting device package. A submount is positioned on a mounting substrate with a flux material therebetween and at least substantially free of solder material therebetween. The submount has a metal bonding layer facing the mounting substrate. A semiconductor light emitting device is positioned on a top side of the submount with a flux material therebetween to provide an assembled stack. The assembled stack is reflowed to attach the metal bonding layer of the submount to the mounting substrate and to attach the light emitting device to the submount.

In some further embodiments, during reflowing of the assembled stack, the flux material between the lower surface of the metal bonding layer and the mounting substrate is at least substantially removed so that the lower surface of the metal bonding layer directly contacts and bonds to the mounting substrate.

In some further embodiments, the metal bonding layer of the submount is formed to have a thickness that is controlled based on surface roughness of an upper surface of the mounting substrate that will be bonded to the metal bonding layer. The surface roughness of the upper surface of the mounting substrate may be measured. The measured surface roughness can then be used to define a thickness of the metal bonding layer formed on the submount.

In some other embodiments, a method of assembly for a semiconductor light emitting device package can include metal plating an upper surface of a mounting substrate using a combination of electrolytic and electroless plating processes. The plated metal is pattern to form a metal bonding pad on the mounting substrate. A metal bonding layer is formed on a submount with a thickness that is defined in response to a surface roughness of the metal bonding pad. The submount is positioned on the upper surface of the mounting substrate with a flux material therebetween and at least substantially free of solder material therebetween, and with the metal bonding layer of the submount facing the mounting substrate. A semiconductor light emitting device is positioned on a top side of the submount with a flux material therebetween to provide an assembled stack. The assembled stack is reflowed to attach the metal bonding layer of the submount to the mounting substrate and to attach the light emitting device to the submount.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 6 is a side view of a semiconductor light emitting device assembled stack with a bonding layer formed according to the operations of FIG. 5 according to some embodiments of the present invention;

FIG. 9 is a flowchart illustrating operations for measuring surface roughness of a mounting substrate and, responsive thereto, controlling thickness of a bonding layer for a submount that is to be bonded to the mounting substrate according to some embodiments of the present invention.

DETAILED DESCRIPTION

Figure 1A:
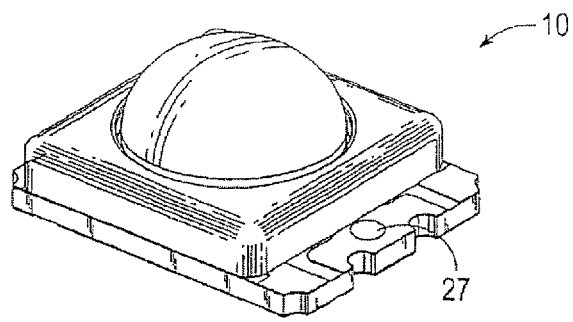
FIG. 1A is a perspective view of semiconductor die package that may be assembled according to various embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "contacting," "connected to" or "coupled to" another element or layer, it can be directly on, contacting, connected or coupled to the other element or layer or intervening elements or layers may be present. In contrast, when an element is referred to as being "directly on," "directly contacting," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

As used herein, the term "semiconductor light emitting device" may include a light emitting diode, laser diode and/or other semiconductor device which includes one or more semiconductor layers, which may include silicon, silicon carbide, gallium nitride and/or other semiconductor materials, a mounting substrate which may include sapphire, silicon, silicon carbide and/or other microelectronic mounting substrates, and one or more contact layers which may include metal and/or other conductive layers. In some embodiments, ultraviolet, blue and/or green light emitting diodes ("LEDs") may be provided.

Some embodiments of the present invention now will be described, generally with reference to gallium nitride-based light emitting diodes on silicon carbide-based mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diode on SiC or sapphire ($Al_2O_3$) mounting substrate and/or a nitride-based diode on gallium nitride, silicon carbide, aluminum nitride, sapphire, zinc oxide and/or other mounting substrates.

Thus, for example, the semiconductor light emitting device may be a gallium nitride-based LED or laser fabricated on a silicon carbide mounting substrate, such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the mounting substrate. In such embodiments, the mounting substrate may be patterned so as to enhance light output of the devices as is described, for example, in the above-cited U.S. Patent Publication No. US 2002/0123164 A1.

As described above, a common way to mount an LED to a submount and to mount a submount to a mounting substrate is by soldering using a solder paste. The solder paste may include particles of a gold-tin (AuSn) alloy of eighty percent Au and twenty percent tin, which is spread between the LED and the submount and between the submount and the mounting substrate to form a solder bond during reflow of the assembled stack. Various processes for assembling light emitting device packages using solder paste are described, for example, in United States Published Patent Application No. 2006/0063287, the disclosure of which is incorporated by reference herein as if set forth fully.

One potential problem with using solder paste to bond the LED and the submount, and to bond the submount and the mounting substrate, is that there can be a substantial variability in the thickness of the layers of the solder paste both before and after the solder reflow process is carried out on the assembled stack. An insufficient thickness of solder paste can result in weak bonds that break during assembly/use, and an overly thick solder paste can squeeze out and create an undesirable shorting layer across adjacent electrical structure. Moreover, variability in the thickness of the solder layers decreases the controllability of the height (Z-dimension) of the assembled stack. In some lighting applications, such as LED lit video projectors, it can be important to control the height of the assembled stack and, in particular, the relative distance between a light emitting surface of the LED and an adjacent focusing lens.

Another potential problem that can occur when using solder paste is that voids can occur between the stacked elements and which can substantially decrease the strength of the bonded stack. Such voids may occur more frequently in a central region of the interface between a submount and a mounting substrate and may lead to physical failure of the bond therebetween during assembly and/or during use of the light emitting device package.

In accordance with various embodiments of the present invention, a flux-eutectic process is used to provide metal-to-metal bond between a mounting substrate and a submount and a metal-to-metal bond between a LED and the submount. In one such embodiment, a submount is positioned on a mounting substrate with a flux material therebetween. The submount has a metal bonding layer facing the mounting substrate. A LED is positioned on a top side of the submount with a flux material therebetween to provide an assembled stack. The assembled stack is reflowed to attach the metal bonding layer of the submount to the mounting substrate and to attach the LED to the submount. Accordingly, the stack may be assembled without use of solder paste between the submount and the mounting substrate and between the light emitting device and the submount.

Although various embodiments are described herein in the context of not using solder material, such as solder paste, it is to be understood that the references herein to "at least substantially free of solder material" refer to the formation of a primary bond between the submount and the mounting substrate and between the light emitting device and the submount using a direct metal-to-metal bond therebetween without intervening solder material. Accordingly, use of a small amount of solder material that does not provide the primary bond between the submount and the mounting substrate and between the light emitting device and the submount is not outside the scope of the present invention.

Figure 1B:
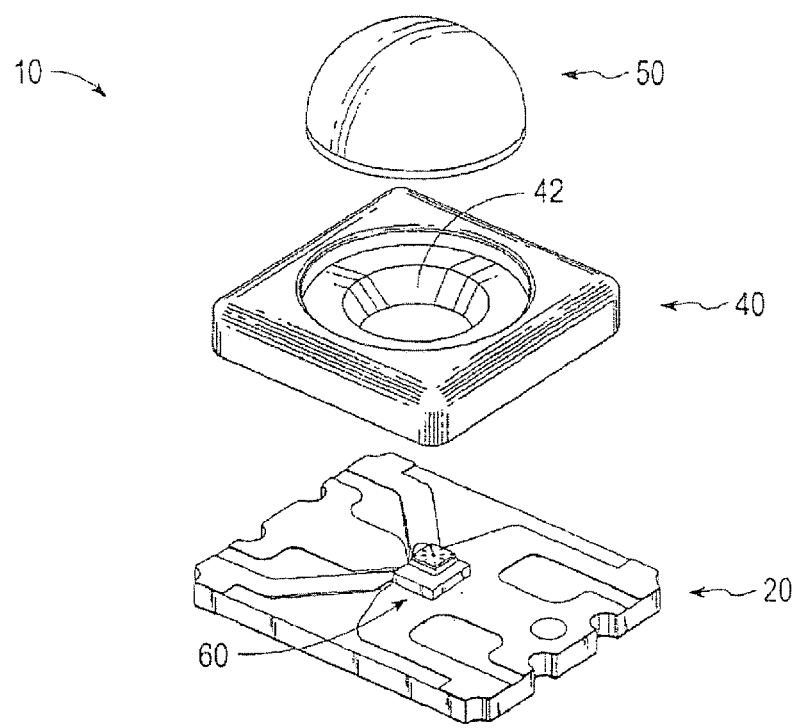
FIG. 1B is an exploded perspective view of the semiconductor die package of FIG. 1A.

FIGS. 1A-1B and 2A-2C illustrate an LED, submount and mounting substrate arrangement that are referenced to describe various embodiments of the present invention. FIG. 1A is a perspective view of a semiconductor die package 10 that may be assembled according to some embodiments of the present invention and FIG. 1B is an exploded perspective view of the semiconductor package of FIG. 1A. Referring to FIGS. 1A and 1B, the illustrated light emitting package 10 includes a mounting substrate 20, a reflector 40 and a lens 50. The mounting substrate 20 and the reflector 40 may further act as heat sinks for an LED assembly 60 mounted on the mounting substrate 20. While the assembly 60 is described herein as including an LED die 66, it will be understood that embodiments of the present invention may also be used with other types of semiconductor light emitting devices.

Figures 2A, 2B:
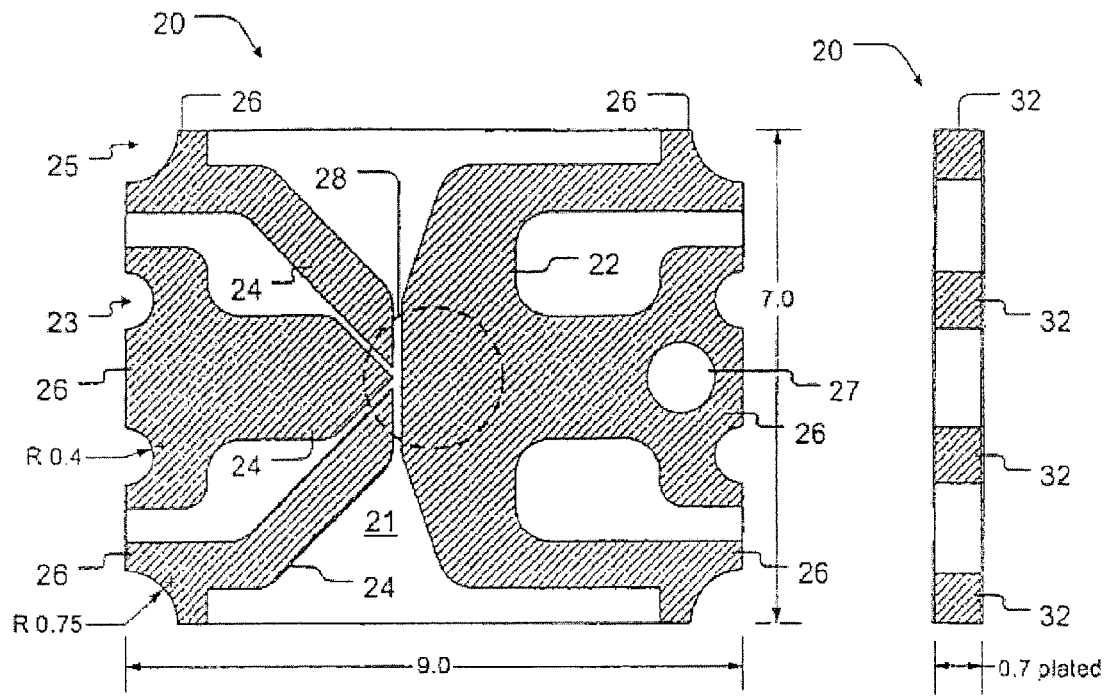
FIG. 2A is a top plan view of a portion of the semiconductor die package of FIG. 1A.
FIG. 2B is a side view of a portion of the semiconductor die package of FIG. 1A.
Figure 2C:
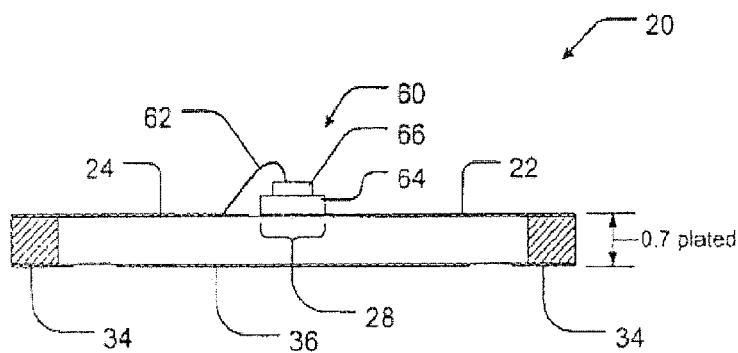
FIG. 2C is a front view of a portion of the semiconductor die package of FIG. 1A.

The mounting substrate 20 is illustrated in more detail in FIGS. 2A through 2C. FIGS. 2A, 2B and 2C provide, respectively, a top view, a side view and a front view of the mounting substrate 20 of FIG. 1A. Further, FIG. 2C also shows the LED assembly 60 in addition to the front view of the mounting substrate 20. The LED assembly 60 is also illustrated in FIG. 1B. Referring to FIGS. 1A through 2D, the mounting substrate 20 may provide support for electrical traces 22 and 24; for metal bonding pads 26, 32, 34 and 36; and for the LED assembly 60. In the figures, to avoid clutter, only representative bonding pads 26, 32, and 34 are indicated with reference numbers. The traces 22 and 24 and the bonding pads 32, 34 and 36 can be fabricated using conductive material. Further, additional traces and connections can be fabricated on the top, side, or bottom of the mounting substrate 20, or layered within the mounting substrate 20. The traces 22 and 24, the bonding pads 26, 32, 34 and 36, and other connections can be interconnected to each other in a variety of combinations using known methods, for example, via holes.

The mounting substrate 20 may be made of a material having high thermal conductivity but that is electrically insulating, for example, a ceramic layer containing aluminum nitride (AlN) or alumina ($Al_2O_3$). Dimensions of the mounting substrate 20 can vary widely depending on application and processes used to manufacture the die package 10. For example, in the illustrated die package 10, the mounting substrate 20 may have dimensions ranging from fractions of millimeters (mm) to tens of millimeters. Although the present invention is not limited to die packages of particular dimensions, one specific die package 10 is illustrated in the figures having various exemplary dimensions denoted therein. Dimensions shown in the figures are in millimeters (for lengths, widths, heights, and radii) and degrees (for angles) except as otherwise designated in the figures or otherwise herein.

The mounting substrate 20 in the illustrated die package 10 has a top surface 21, the top surface 21 including the electrical traces 22 and 24. The traces 22 and 24 provide electrical connections from the metal bonding pads (for example top bonding pads 26) to a central metal bonding pad 28. The top bonding pads 26 are portions of the traces 22 and 24 generally proximal to sides of the mounting substrate 20. The top bonding pads 26 are electrically connected to side bonding pads 32. The central bonding pad 28 is a portion of the top surface (including portions of the trace 22, the trace 24, or both) where the LED assembly 60 is mounted. The central bonding pad 28 may be located proximal to center of the top surface 21.

The traces 22 and 24 provide electrical routes to allow the LED assembly 60 to electrically connect to the bonding pads 26, 32, 34 and/or 36. Accordingly, some of the traces are referred to as first traces 22 herein while other traces are referred to as second traces 24. In the illustrated die package 10, the central bonding pad 28 includes portions of both the first traces 22 and the second traces 24. As shown in the figures, the LED assembly 60 is placed on the first trace 22 portion of the central bonding pad 28 thereby making contact with the first trace 22. The top of the LED assembly 60 and the second traces 24 are illustrated as connected to each other via a bond wire 62. Depending on the construction and orientation of LED assembly 60, the first traces 22 may provide anode (positive) connections and second traces 24 may provide cathode (negative) connections for the LED assembly 60 (or vice versa).

The LED assembly 60 can include additional elements. For example, in FIGS. 1B and 2C, the LED assembly 60 is illustrated including the LED bond wire 62, an LED submount 64 and a LED die 66. Multiple bond wires may be used in other mounting configurations. The central bonding pad 28 can be configured for mounting of a flip-chip arrangement of the LED assembly 60. Additionally, multiple LED assemblies can be mounted on the central bonding pad 28. The LED assembly 60 may also be mounted over multiple traces. The traces 22 and 24 may be made of conductive material such as gold, silver, copper, tin and/or other metals. The traces 22 and 24 can have dimensions as illustrated in the figures and have thickness in the order of microns or tens of microns depending on application. For example, the traces 22 and 24 can be 75 microns thick. FIGS. 1A and 2A illustrate an orientation marking 27. Such markings can be used to identify the proper orientation of the die package 10 even after assembling the die package 10. The orientation marking 27 need not be a via or a through hole. The traces 22 and 24, as illustrated, can extend from the bonding pad 28 to sides of the mounting substrate 20.

Continuing to refer to FIGS. 1A through 2C, the illustrated mounting substrate 20 defines semi-cylindrical spaces 23 and quarter-cylindrical spaces 25 proximal to its sides. The semi-cylindrical spaces 23 and the quarter-cylindrical spaces 25 may provide convenient delineation and break points during the manufacturing process.

Figure 3:
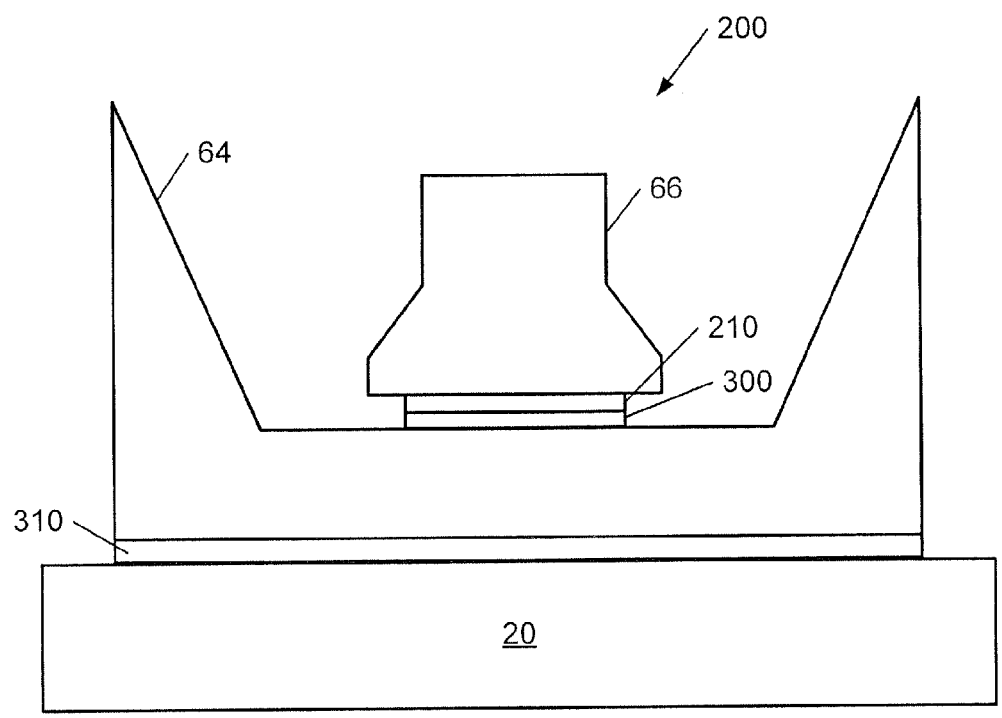
FIG. 3 is a side view of a semiconductor light emitting device assembled stack before reflowing according to some embodiments of the present invention.

FIG. 3 is a schematic side view of a semiconductor light emitting device assembled stack 200 according to some embodiments of the present invention. As shown in FIG. 3, the LED die 66 is bonded to the submount 64, which, in turn, is bonded to the mounting substrate 20 to form the assembled stack 200. The submount 64 includes a metal bonding layer 310. The LED die 66 includes an epitaxial layer or layers 210 and a metal bonding layer 300. In accordance with some embodiments, the metal bonding layer 300 of the LED die 66 is directly bonded to metal of the submount 64, and the metal bonding layer 310 of the submount 64 is directly bonded to the central bonding pad 28 of the mounting substrate 20.

More particularly, formation of these metal-to-metal bonds can be carried out at least substantially free of solder material therebetween.

Accordingly, the stack 200 may be assembled without use of solder paste between the submount 64 and the mounting substrate 20 and between the LED die 66 and the submount 64. Although various embodiments are described in the context of not using solder material, such as solder paste, it is to be understood that the primary bond between the metal bonding layer 300 and the submount 64 and between the metal bonding layer 310 and the central bonding pad 28, is a direct metal-to-metal bond therebetween that is at least substantially free of intervening solder material. Accordingly, use of a small amount of solder material that may augment but does not provide the primary bond between the submount 64 and the mounting substrate 20 and between the LED die 66 and the submount 64 is not outside the scope of the present invention.

The metal bonding layers 300 and 310 may include a high temperature bonding material such as a gold-tin (AuSn) alloy with eighty percent gold and twenty percent tin, or may include other alloys such as Tin-silver (SnAg, e.g., 96.5%/3.5% which melts at 221° C.) and/or lead-tin (PbSn, e.g., 38%/62% which melts at 181° C.). Although the metal bonding layers 300 and 310 may be formed from metals that are different from one another, it may be advantageous to form the metal bonding layers 300 and 310 from the same or similar high temperature bonding material to facilitate simultaneous bonding of the metal bonding layer 300 to the submount 64 and the metal bonding layer 310 to the mounting substrate 20 during a single reflow process.

Figure 4:
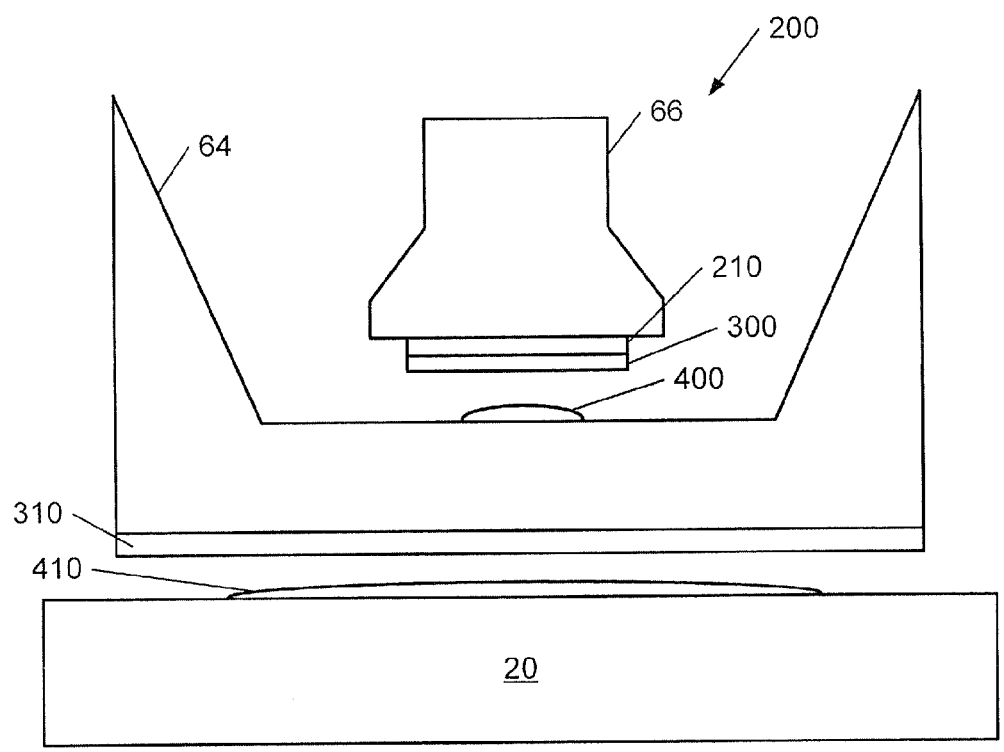
FIG. 4 is a side view during assembly of the stack of FIG. 3 and which illustrates placement of flux dots during assembly according to some embodiments of the present invention.
Figure 5:
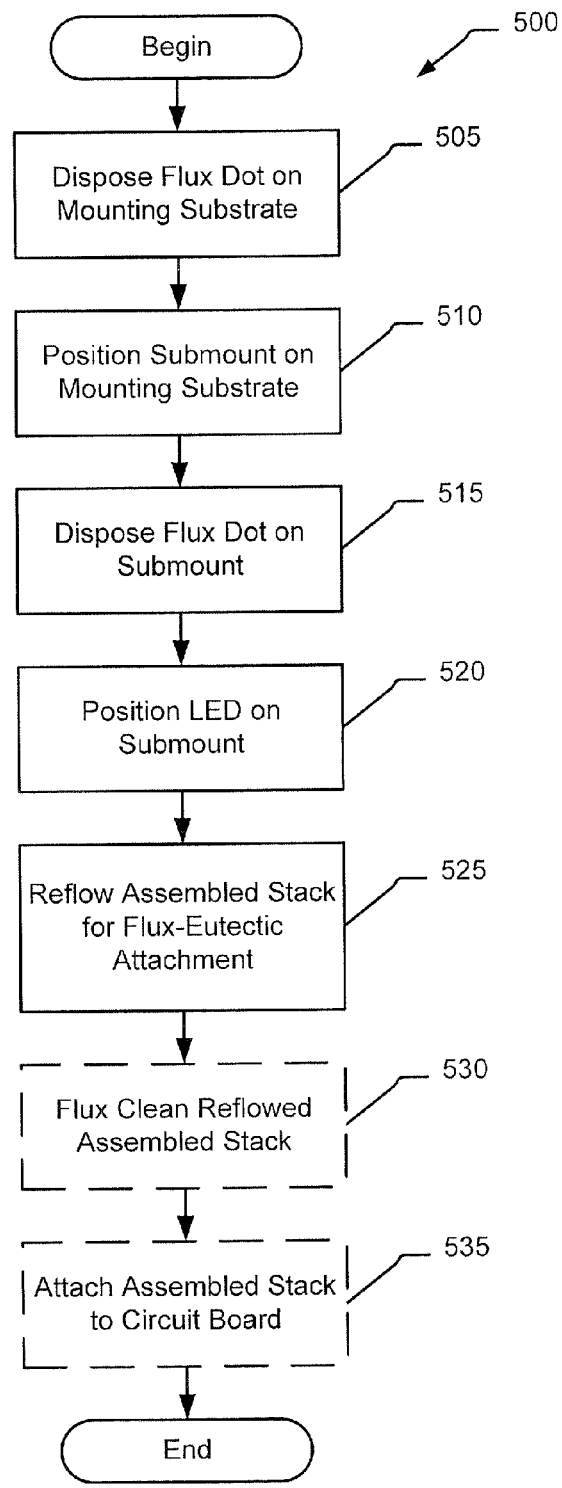
FIG. 5 is a flowchart illustrating operations for assembly of a semiconductor light emitting device package according to some embodiments of the present invention.

FIG. 4 is a schematic side view during assembly of the stack of FIG. 3. FIG. 5 is a flowchart illustrating operations 500 for assembly of the stack 200 according to some embodiments of the present invention. FIG. 8 is a schematic block diagram of an assembly apparatus suitable for use in carrying out operations according to some embodiments of the present invention. Referring to FIGS. 4, 5, and 8, the metal layer of the central bonding pad 28 and the bonding pads 26, 32, 34, and 36 may be formed by many methods such as thick film with firing and/or thin film with plating, such as using a Ti sputter layer and then a combination of electroless and direct current (DC) plating process that is carried out on the top surface 21 of the mounting substrate 20. The mounting substrate 20 can include a ceramic core that is sliced from a cylinder, diced, and then burnished to smooth the top surface 21 in preparation for the metal application process. Although further polishing processes may be carried out on the top surface 21, the surface roughness of the burnished top surface 21 may instead be reduced by increasing the thickness of the conductive material that is plated thereon.

Using a metal plating apparatus 805, the mounting substrate 20 can be immersed in an aqueous plating solution bath containing copper and a reducing agent and subjected to a direct current through an anode for a sufficient time to provide, for example, a 75 μm layer of copper across the top surface 21. The top surface of the plated copper layer can be smoother than the top surface of the core underneath, and can be smoother than a copper layer that may alternatively be formed using a pulsed plating process. A pulsed plating process uses an electric field that is generated across an anode and the mounting substrate 20 (cathode) to plate copper or another metal on the mounting substrate 20, and can result in a rougher surface. A combination of electroless and electrolytic plating can substantially reduce/eliminate blisters that can form in the plated copper. Various different materials can be used to form the conducting layer, however, Cu may be advantageously used because of its thermal conduction properties and the Cu may be plated with electroless Ag and/or Au in a thin layer to limit oxidation.

The plated metal can be burnished to further smooth its top surface and can be patterned (e.g., etched) by apparatus 810 to form the bonding pad 28 and the bonding pads 26, 32, 34, and 36.

A flux dot 410 is disposed (block 505) on the bonding pad 28 of the mounting substrate 20. The flux dot 410 may be formed using a flux pin transfer apparatus 820 that dips a pen in a flux solution and then transferring a resulting drop on the pin to the mounting substrate 20. The flux material may be a high temperature flux to avoid burn-off of the flux before reaching the melting point of the bonding layers 300 and 310. An exemplary flux material includes, but is not limited to, TACFlux007 by Indium Corporation.

A pick and place apparatus 815 positions (block 510) and presses the submount 64 including the bonding layer 310 into the flux dot 410 to directly contact the bonding pad 28 of the mounting substrate 20 through a thin film of the flux material. The squished flux dot 410 forms a blocking layer around the periphery of the interface between the metal bonding layer 310 and the bonding pad 28 to inhibit oxidation during subsequent reflow bonding of the contacting surfaces of the metal bonding layer 310 and the bonding pad 28.

The flux pin transfer apparatus 820 forms another flux dot 400 (block 515) on the submount 64, such as by repeating the transfer process described above. The pick and place apparatus 815 positions (block 520) and presses the LED die 66 including the bonding layer 300 into the flux dot 400 to directly contact the submount 64 through a thin film of the flux material. The squished flux dot 400 forms a blocking layer around the periphery of the interface between the metal bonding layer 300 and the submount 64 to inhibit oxidation during reflow bonding of the contacting surfaces of the metal bonding layer 300 and the submount 64.

The assembled stack 200 is reflowed (block 525) by heating it in an oven 825 to a temperature that at least partially melts the bonding layers 300 and 310 to form a metal-to-metal bond between the bonding layer 300 and the submount 64 and between the bonding layer 310 and the mounting substrate 410. The reflow process may include moving the assembled stack 200 on a conveyor belt through the oven where it is heated to at least the eutectic temperature of the bonding layers 300 and 310 and for at least a sufficient time to at least partially melt the bonding layers 300 and 310. When the bonding layers 300 and 310 includes a 80:20 gold-tin alloy, the oven may be heated to above the 280° C. eutectic temperature of the alloy (e.g., above 300° C.) and the assembled stack 200 may be moved therethrough at a rate that maintains the temperature profile of the stack 200 within the desired range for about six minutes.

As a result, metal-to-metal bonds are formed between the bonding layer 300 and the submount 64 and between the bonding layer 310 and the mounting substrate 410. Both a mechanical and an electrical connection may thereby be provided by the metal-to-metal bonds.

It will be understood that various process parameter specifications during reflow, such as heating in the reflow oven 825, may beneficially improve process performance. For example, the amount of flux material disposed between the submount 64 device and the mounting substrate 20 and the rate of heating may be selected to prevent boiling, which may launch the submount 64 off the mounting substrate 20 during processing, while still providing for reflow to form a nonoxidized metal-to-metal bond before volatilizing of the flux positioned between the submount 64 and the mounting substrate 20.

The risk of oxidation at the metal-to-metal bonds may also be further reduced by using a nitrogen atmosphere in the reflow oven 825 to reduce/remove oxygen from the vicinity of the assembled stack 200 during the reflow operation (block 525). In some embodiments of the present invention, the amount of flux dispensed may be reduced when a nitrogen atmosphere is provided in the reflow oven 825. The flux dots 400 and 410 may be formed to have a diameter that is sufficient to fully wet the interface surfaces between the bonding layer 300 and the submount 64 and between the bonding layer 310 and the mounting substrate 20 during the reflow operation.

Additional processing steps may optionally be carried out to incorporate the reflowed assembled stack 200 into particular electronic application environments. During the reflowing (block 525) of the assembled stack 200, the flux material between the bonding layer 310 and the mounting substrate 200 is removed (e.g., burned off) so that a lower surface of the bonding layer 310 directly contacts and bonds to the central bonding pad 28 of the mounting substrate 20. Following the reflow operation, any residual flux material may be removed (block 530) from exposed surfaces of the reflowed assembled stack 200 using a cleaning apparatus 830. Wire bonding, or other electrical connection processes, may be carried out on the reflowed assembled stack 200 using a wire bonding apparatus 835. The reflowed assembled stack 200 may be attached (block 535) to a circuit board using, for example, a medium or low temperature solder reflow process and without further reflowing of the submount 64 to the mounting substrate 20 or the LED die 66 to the submount 64.

In accordance with some further embodiments, the thickness of the metal bonding layer 310 is controlled based on the roughness of the top surface 21 of the mounting substrate 20. FIG. 6 is a side view of the partially assembled stack 200 of FIG. 4 and illustrates that the thickness "T" of the metal bonding layer 310 is controlled based on the roughness (R(z)) of the bonding pad 28 on the mounting substrate 20.

Figure 7A:
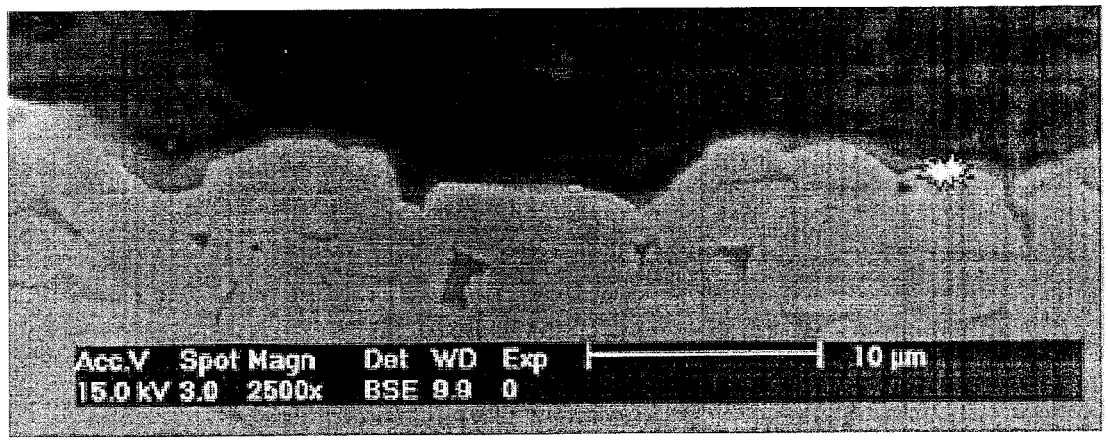
FIGS. 7A and 7B are exploded cross-sectional photographs of portions of mounting substrate, with FIG. 7B further showing a portion of a submount, that illustrate an exemplary surface roughness Rz of the interfacing surfaces of the submount and the mounting substrate.
Figure 7B:
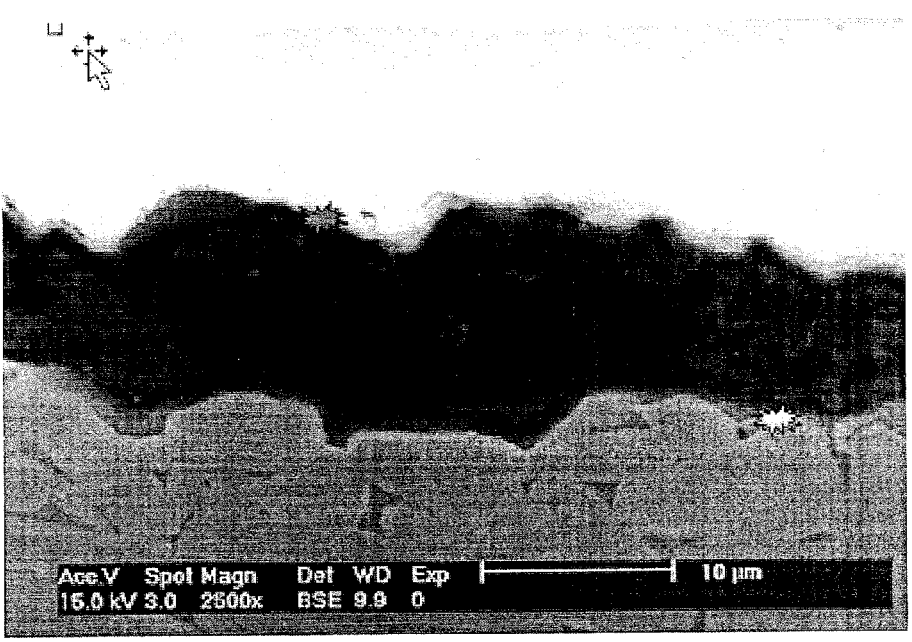

FIG. 7A is an exploded cross-sectional photograph of a portion of a mounting substrate and illustrates the exemplary surface roughness Rz of a typical substrate-grade ceramic mounting substrate. FIG. 7B is another exploded cross-sectional photograph showing a portion of a mounting substrate and a submount, and further illustrates the corresponding surface roughness Rz of the interfacing surfaces of a typical ceramic submount and a typical ceramic mounting substrate.

Figure 8A:
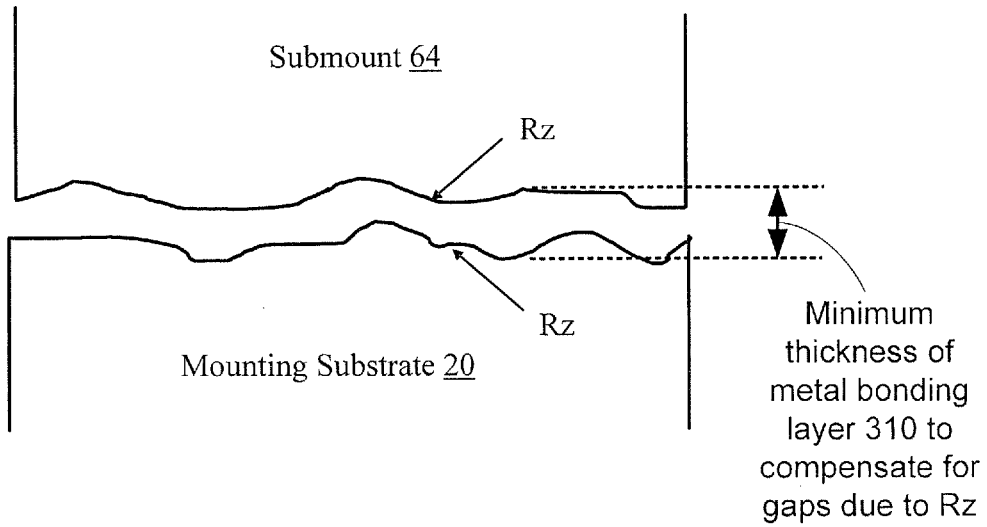
FIGS. 8A and 8B are exploded cross-sectional views of portions of the submount and the mounting substrate that illustrate how the thickness of the metal bonding layer is varied in response to the roughness Rz of the interfacing surfaces of the submount and the mounting substrate.
Figure 8B:
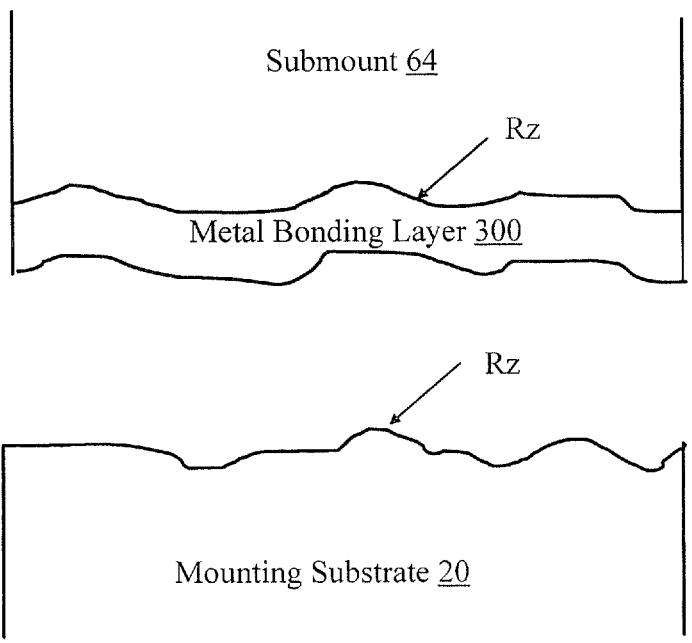
Figure 10:
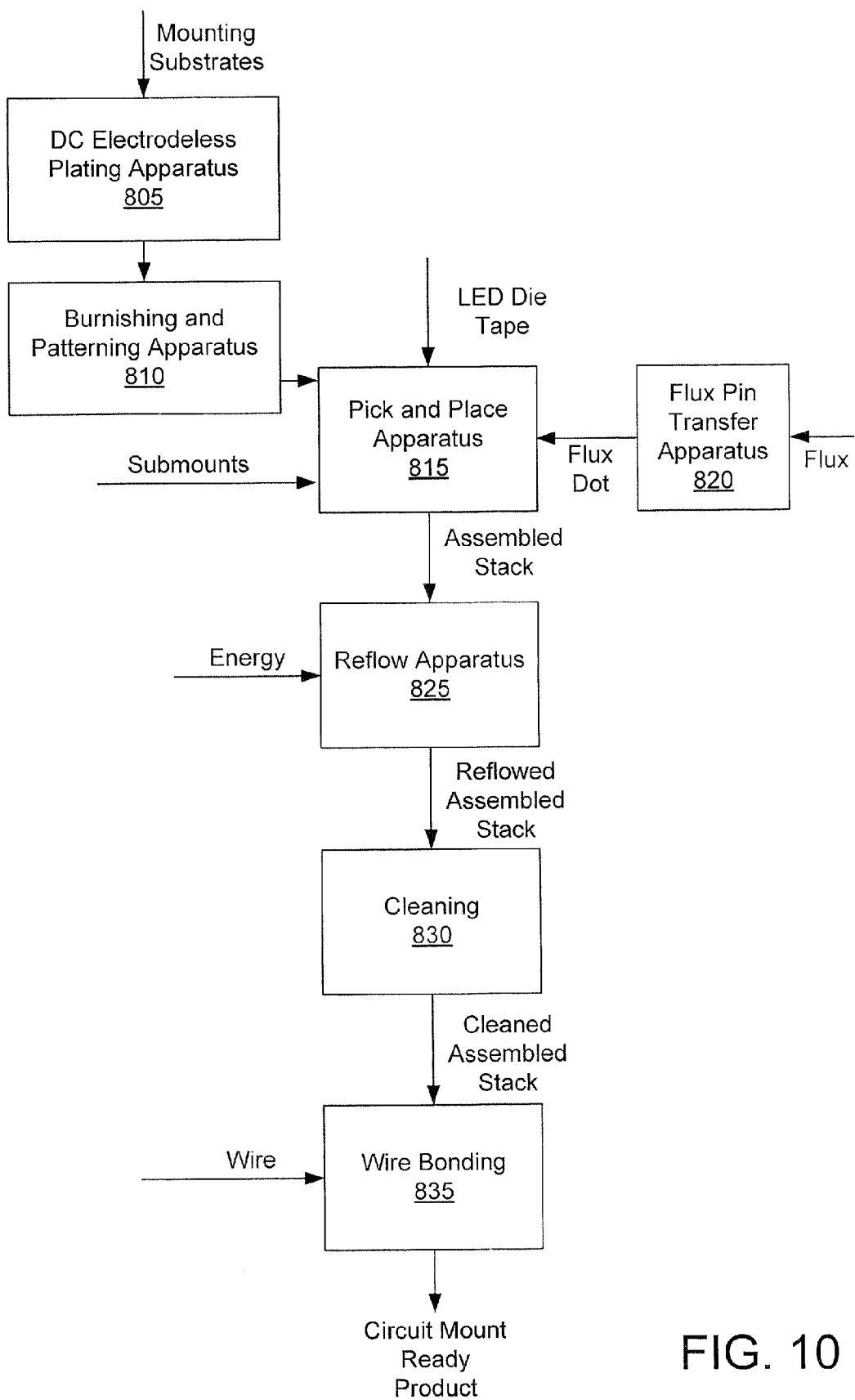
FIG. 10 is a schematic block diagram of a semiconductor light emitting device assembly apparatus suitable for use in carrying out operations according to some embodiments of the present invention.

FIGS. 8A and 8B are exploded cross-sectional schematic views of portions of the submount 64 and the mounting substrate 20 that illustrate how the thickness of the metal bonding layer 310 is varied in response to the roughness Rz of the interfacing surfaces of the submount 64 and the mounting substrate 20. FIG. 9 is a flowchart that illustrates operations 700 for measuring the surface roughness of the mounting substrate 20 and, responsive thereto, for controlling thickness of the metal bonding layer 310. FIG. 10 is a schematic block diagram of a semiconductor light emitting device assembly apparatus suitable for use in carrying out operations according to some embodiments of the present invention.

Referring to FIG. 8A, the magnified illustration of an interface between the submount 64 and the mounting substrate 20 shows the peaks and valleys that characterize their respective surface roughness Rz. To ensure that a sufficiently strong bond is obtained when the submount 64 is mounted to the mounting substrate 20, the minimum thickness of the metal bonding layer 310 is defined in response to the surface roughness Rz and, more particularly, can be defined so that when it is reflowed it fills the maximum void occurring along the interface when the submount 64 is positioned on the mounting substrate 20. Accordingly, the bonding layer 310 shown in FIG. 8B can have a thickness that is defined based on a measurement of the surface roughness along the interface between the submount 64 and the mounting substrate 20, and which can be a sufficient thickness to substantially reduce/eliminate formation of voids along the interface after reflowing. Referring to FIGS. 6, 9, and 10, the top surface 21 of the mounting substrate 20 is plated (block 705) with a metal layer (e.g., 75 μm of copper) using, for example, an electroless and a direct current plating apparatus 805 that carries out the process described above. The plated metal may be burnished using the burnishing apparatus 810 to increase the smoothness of the exposed surface of the plated metal. The roughness (Rz) of an upper surface of the metal plated mounting substrate 20 is measured (block 710). The roughness (Rz) may be measured before the plated metal is patterned to form the central bonding pad 28 and the bonding pads 26, 32, 34, and 36. Alternatively, the roughness (Rz) of the upper surface of the mounting substrate 20 may be measured before it is plated with the metal layer.

The smoothness of the side of the submount 64 that will contact the mounting substrate 20 can also be important when defining the thickness of the metal bonding layer 310. A fine polish process can be carried out on the facing side of the submount 64 to provide a smoother surface (lower Rz) than a rough polish thereof, and which as described below may enable use of thinner layer of the metal bonding layer 310 defined on the submount 64. The thickness of the metal bonding layer 310 is defined as a function of the Rz of the mating surfaces.

The surface roughness (Rz) may be measured using conventional techniques, including, but not limited to, observation of an optical magnification of the surface, moving a stylus across the surface and electronically measuring perturbations of the stylus, and/or via interferometry measurement of light wave interface patterns generated from the surface. The thickness of the metal bonding layer 310 is defined (block 715) in response to the measured surface roughness (Rz).

As can be appreciated, it would not be feasible to measure surface roughness of every mounting substrate and/or submount in a very high production volume assembly process. Accordingly, measurements may be carried out on a group of mounting substrates and/or submounts that are characteristic of what will be used in the assembly process, and the thickness of the metal bonding layer 310 can be defined based on those characteristic measurements. The LED die 66 can then be manufactured with a metal bonding layer having the defined thickness.

The metal bonding layer 310 having the defined thickness is formed on the epitaxial layer 210 of the LED die 66 and is attached (block 720), such as by the reflowing process of block 525 of FIG. 5, to the bonding pad 28 of the mounting substrate 20.

By way of example and without limitation on the breadth of the present application, example roughness along interfacing surfaces of a ceramic mounting substrate and submount and the corresponding ranges of an AuSn metal bonding layer that may be sufficient to compensate for gaps due to the surface roughness will now be described. A typical ceramic mounting substrate with a metal layer that is plated or fired onto its course surface may have a course surface roughness that exceeds 5 μm. In contrast, the surface roughness of a typical ceramic mounting substrate that has been polished to remove course irregularities and/or that has been metal plated may have a medium surface roughness in a range of 3 µm to 5 µm. The surface roughness of a typical ceramic mounting substrate that has been finely polished and/or that has been attached to a Cu leadframe (attached to a cold-rolled copper layer) may have a fine surface roughness in a range of 1 µm to 3 µm. The surface roughness of a typical ceramic mounting substrate that has been very finely polished and that has been plated with Cu and then again finely polished may have a very fine surface roughness below 1 µm. When the substrate used for bonding is metal leadframe based, it is typical that finishes of the metal can be below 1 µm Rz, such as 0.5 µm.

Similarly, a typical submount that has a course polished surface (facing the substrate) with a sputtered metal layer may have a medium surface roughness that exceeds 3 µm. In contrast, the surface roughness of a typical submount that has been more finely polished to remove course irregularities and has been sputter metal plated may have a fine surface roughness in a range of 1 µm to 3 µm. The surface roughness of a typical submount that has been finely polished and that has been sputter metal plated and again finely polished may have a very fine surface roughness below 1 µm.

The thickness of the metal bonding layer 310 can be defined as a desired multiple of the measured surface roughness (e.g., as the combined roughness of the interface surfaces). The inventors of the present application have found that a ratio of 1.5:1 may be used to define a thickness of the metal bonding layer 300 relative to the combined (added) surface roughness of the submount 64 and the mounting substrate 20 to provide an acceptable bond along their interface. In other words, the summed value of the surface roughness of the submount 64 and the mounting substrate 20 divided by a value for the thickness of the metal bonding layer 300 may advantageously be 1.5 to provide an acceptable bond strength between the mounting substrate 20 and the submount 64.

For example, when a mounting substrate 20 having a course surface with a roughness $Rz_1$ of 5 µm is to be attached to a submount 64 having a very fine surface roughness $Rz_2$ of 1 µm, the metal bonding layer 300 should be formed with a thickness determined from the combined roughness of 6 µm (i.e., $Rz_1$ of 5 µm+$Rz_2$ of 1 µm) divided by 1.5 (desirable ratio of 1.5:1), which provides a desired metal bonding layer 300 thickness of 4 µm.

X-ray analysis can be used in a non-destructive process to observe voiding that may result along the interface, and a destructive process can be used to measure shear strength and/or voiding percentages along the interface. The ratio may therefore be defined in response to analysis that is carried out on exemplary assembled stacks of the submount 64 and mounting substrate 20 to defined a desirable ratio that results in no more than an acceptable amount voiding along the interface.

The flowcharts of FIGS. 5 and 9 and the schematic illustration of FIG. 10 illustrate the functionality and operation of possible implementations of methods for assembly of semiconductor light emitting devices according to some embodiments of the present invention. It should be noted that, in some alternative implementations, the acts noted in describing the figures may occur out of the order noted in the figures. For example, two blocks/operations shown in succession may, in fact, be executed substantially concurrently, or may be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of assembly for a semiconductor light emitting device package, the method comprising:
    forming a metal bonding layer on a submount, the metal bonding layer having a thickness that is controlled in response to a combined surface roughness of an upper surface of a mounting substrate and a surface of the submount, the submount and the metal bonding layer providing a submount structure;
    positioning the submount structure on the mounting substrate, wherein a flux material is between the metal bonding layer and the mounting substrate, and no solder paste with suspended metal alloy particles is between the metal bonding layer and the mounting substrate, and the metal bonding layer is a solid material when the submount structure is positioned on the mounting substrate;
    positioning a semiconductor light emitting device on a top side of the submount opposite the mounting substrate with a flux material therebetween to provide an assembled stack; and
    reflowing the assembled stack to attach the metal bonding layer of the submount structure to the mounting substrate and to attach the light emitting device to the submount.

2. The method of claim 1, wherein:
    positioning the submount structure on the mounting substrate further comprises directly contacting at least a major portion of a lower surface of the metal bonding layer to the mounting substrate through a thin film of the flux material, with the flux material forming a blocking layer around a periphery of the interface between the metal bonding layer and the mounting substrate to inhibit and remove oxidation of the lower surface of the metal bonding layer during the reflowing of the assembled stack.

3. The method of claim 2, wherein, during reflowing of the assembled stack, the flux material between the lower surface of the metal bonding layer and the mounting substrate is at least substantially removed so that the lower surface of the metal bonding layer directly contacts and bonds to the mounting substrate.

4. The method of claim 2, further comprising placing a dot of the flux material on the mounting substrate before positioning the submount structure, wherein the dot of the flux material is placed on a metal bonding pad of the mounting substrate, and positioning the submount structure includes pressing the submount into the flux dot to directly contact the mounting substrate through the thin film of the flux material.

5. The method of claim 4, wherein:
    positioning the submount structure on the mounting substrate further comprises directly contacting the lower surface of the metal bonding layer to the metal bonding pad of the mounting substrate through a thin film of the flux material; and reflowing the assembled stack comprises heating the assembled stack in an oven to a temperature that provides a bond directly between the metal bonding layer of the submount and the metal bonding pad of the mounting substrate.

6. The method of claim 1, wherein:
positioning the submount structure on the mounting substrate further comprises directly contacting a lower surface of the metal bonding layer to the mounting substrate with the flux material forming a blocking layer around a periphery of the interface between the metal bonding layer and the mounting substrate to inhibit oxidation of the lower surface of the metal bonding layer during the reflowing of the assembled stack.

7. The method of claim 1, wherein reflowing the assembled stack comprises heating the assembled stack in an oven to a temperature that provides a bond directly between the metal bonding layer of the submount and metal in the mounting substrate and between metal in the mounting substrate and metal in the light emitting device.

8. The method of claim 7, wherein the metal bonding layer comprises AuSn and, during reflowing of the assembled stack, the assembled stack is heated to above 280° C. for a sufficient length of time to form a metal-to-metal bond directly between the metal bonding layer and the mounting substrate and between the mounting substrate and the light emitting device.

9. The method of claim 1, wherein the metal bonding layer is formed with a thickness of about 3 μm when the metal bonding layer is to be bonded to a metal layer on a surface of the mounting substrate that has been burnished after the ceramic mounting substrate has been diced from a ceramic rod.

10. The method of claim 1, further comprising measuring the surface roughness of the upper surface of the mounting substrate that will be bonded to the metal bonding layer, and using the measured surface roughness to define a thickness of the metal bonding layer formed on the submount.

11. The method of claim 1, further comprising metal plating the upper surface of the mounting substrate using a direct current electrodeless plating process to form a smooth upper surface on the mounting substrate to which the metal bonding layer of the submount is bonded during the reflowing of the assembled stack.

12. The method of claim 11, further comprising burnishing the plated metal on the upper surface of the mounting substrate to increase its smoothness before reflowing the assembled stack to attach the metal bonding layer of the submount to the burnished metal plated upper surface of the mounting substrate.

13. The method of claim 1, wherein the metal bonding layer comprises gold-tin (AuSn).

14. The method of claim 1, wherein the light emitting device comprises a light emitting diode (LED).

15. A method of assembly for a semiconductor light emitting device package, the method comprising:

metal plating an upper surface of a mounting substrate using at least one of a sputter process, a electroless process, and a direct current and/or pulsed electroplating process;
patterning the plated metal on the mounting substrate to form a metal bonding pad;
forming a metal bonding layer on a submount with a thickness that is defined in response to a combined surface roughness of the metal bonding pad and a surface of the submount, wherein the metal bonding layer and the submount form a submount structure;
positioning the submount structure on the upper surface of the mounting substrate wherein a flux material is between the metal bonding layer and the mounting substrate, and no solder paste with suspended metal alloy particles is between the metal bonding layer and the mounting substrate, and the metal bonding layer is a solid material when the submount structure is positioned on the mounting substrate;
positioning a semiconductor light emitting device on a top side of the submount with a flux material therebetween to provide an assembled stack; and
reflowing the assembled stack to attach the metal bonding layer of the submount structure to the mounting substrate and to attach the light emitting device to the submount.

16. The method of claim 1,
wherein the combined surface roughness and the thickness of the metal bonding layer provide a ratio, and
wherein forming the metal bonding layer comprises forming the metal bonding layer on the submount to the thickness that provides the ratio with the combined surface roughness.

17. The method of claim 15,
wherein the combined surface roughness and the thickness of the metal bonding layer provide a ratio, and
wherein forming the metal bonding layer comprises forming the metal bonding layer on the submount to the thickness that provides the ratio with the combined surface roughness.

18. The method of claim 16,
wherein the ratio comprises a ratio of the combined surface roughness to the thickness of the metal bonding layer of 1.5:1, and
wherein forming the metal bonding layer comprises forming the metal bonding layer on the submount to the thickness that provides the ratio of the combined surface roughness to the thickness of the metal bonding layer of 1.5:1.

19. The method of claim 17,
wherein the ratio comprises a ratio of the combined surface roughness to the thickness of the metal bonding layer of 1.5:1, and
wherein forming the metal bonding layer comprises forming the metal bonding layer on the submount to the thickness that provides the ratio of the combined surface roughness to the thickness of the metal bonding layer of 1.5:1.

* * * * *